United States Patent
Araki

(10) Patent No.: US 9,543,947 B2
(45) Date of Patent: Jan. 10, 2017

(54) SEMICONDUCTOR DEVICE

(71) Applicant: RENESAS ELECTRONICS CORPORATION, Kawasaki (JP)

(72) Inventor: Masahiro Araki, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 37 days.

(21) Appl. No.: 14/287,203

(22) Filed: May 27, 2014

(65) Prior Publication Data

US 2015/0002219 A1 Jan. 1, 2015

(30) Foreign Application Priority Data

Jun. 27, 2013 (JP) .................................. 2013-135092

(51) Int. Cl.
    *H03K 17/96* (2006.01)
(52) U.S. Cl.
    CPC . *H03K 17/962* (2013.01); *H03K 2217/960705* (2013.01); *H03K 2217/960725* (2013.01)
(58) Field of Classification Search
    CPC ............ G06K 19/0707; G06K 19/0712; G06K 19/0716
    See application file for complete search history.

(56) References Cited

U.S. PATENT DOCUMENTS

| | | | |
|---|---|---|---|
| 6,952,121 B1 * | 10/2005 | Vu | ...................... H03K 23/667 327/115 |
| 7,312,616 B2 | 12/2007 | Snyder | |
| 7,812,877 B2 | 10/2010 | Suzuki et al. | |
| 8,089,289 B1 | 1/2012 | Kremin et al. | |
| 2012/0286800 A1 | 11/2012 | Maharyta et al. | |

FOREIGN PATENT DOCUMENTS

| | | |
|---|---|---|
| JP | 2001-185964 A | 7/2001 |
| JP | 2001-324519 A | 11/2001 |
| JP | 2004-325419 A | 11/2004 |
| JP | 2007-102563 A | 4/2007 |
| JP | 2008-199408 A | 8/2008 |

OTHER PUBLICATIONS

Japanese Office Action received in corresponding Japanese Application No. 2013-135092 dated Oct. 25, 2016.

* cited by examiner

*Primary Examiner* — Sibin Chen
(74) *Attorney, Agent, or Firm* — Mattingly & Malur, PC

(57) ABSTRACT

A semiconductor device containing a terminal, a power supply voltage dropping circuit that generates a constant voltage, a switch circuit to periodically apply a constant voltage to a terminal in response to a first clock, a current-controlled oscillator circuit, and a counter, and in which the power supply voltage dropping circuit supplies a first current to the switch circuit, the current-controlled oscillator circuit generates a second clock whose frequency changes in response to the value of the first current, and the counter counts the number of second clocks within the counting time.

14 Claims, 13 Drawing Sheets

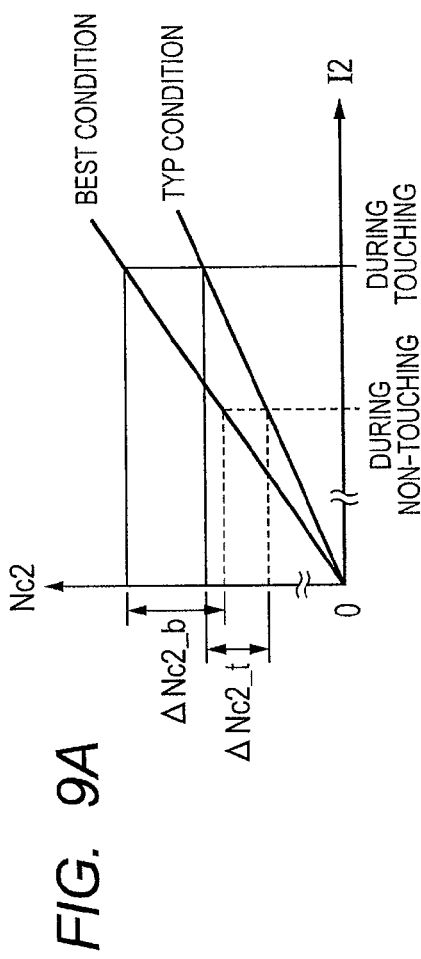
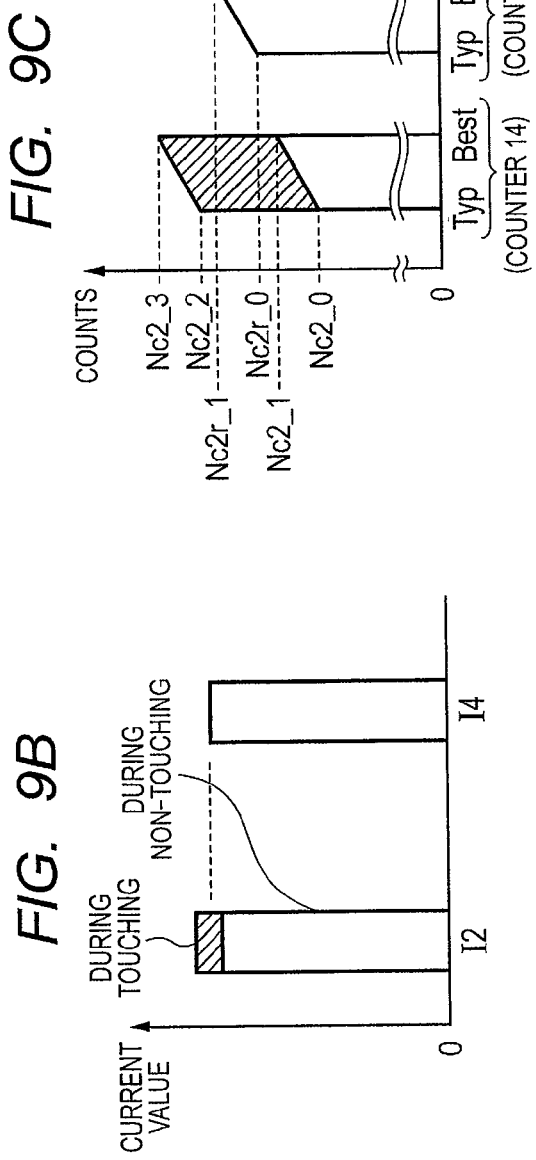
FIG. 9A
FIG. 9B
FIG. 9C

SEMICONDUCTOR DEVICE

CROSS-REFERENCE TO RELATED APPLICATIONS

The disclosure of Japanese Patent Application No. 2013-135092 filed on Jun. 27, 2013 including the specification, drawings and abstract is incorporated herein by reference in its entirety.

BACKGROUND

The present invention relates to a semiconductor device and for example a semiconductor device containing a capacitive touch sensor circuit.

Capacitive touch sensor circuits are commonly utilized in the touch key and touch screen technical field. U.S. Pat. No. 8,089,289 discloses a structure for modulating a signal output from the switching capacitance circuit into a digital signal by using a sigma-delta modulator circuit. U.S. Pat. No. 7,312,616 discloses a structure that measures the value of a target measurement capacitance by comparing on a comparator, a reference voltage with a terminal voltage for a target measurement capacitance that is repeatedly charged and discharged at a specified frequency. Japanese Unexamined Patent Application Publication No. 2008-199408 discloses an oscillator whose frequency changes by touching or non-touching from an operating section and a structure for detecting a change in frequency of frequency signals output by the oscillator.

SUMMARY

As disclosed in U.S. Pat. No. 8,089,289, a technology for measuring a capacitance value by utilizing a comparator to compare a reference voltage with a detection voltage generated based on a periodic charge-discharge current is a commonly used technology. The comparator is a circuit for judging tiny voltage differences between the detection voltage and the reference voltage, and converting those judgment results into a digital signal. Noise superimposed on a system containing a sigma-delta modulator circuit, exerts an effect on the tiny voltage differences, inducing decision errors in the comparator.

The sigma-delta modulator circuit contains a structure that samples the output from the comparator by way of the clock so deviations in the sampling results caused by noise, will appear as an offset in the comparator input, and cause a drop in measurement accuracy. Other issues and new features will become readily apparent from the description in the specification and the accompanying drawings.

According to an aspect of the invention, a semiconductor device includes a terminal, a power supply voltage dropping circuit that generates a constant voltage, a switch circuit to periodically apply a constant voltage to a terminal in response to a first clock, a first current-controlled oscillator circuit, and a first counter; and in which the power supply voltage dropping circuit supplies a first current to the switch circuit, the first current-controlled oscillator circuit generates a second clock whose frequency changes in response to the value of the first current, and the first counter counts the number of second clocks within the counting time.

According to the aspect of the invention, the effects due to noise are removed during detecting of fluctuations in capacitance from the touch electrode and maintain the decision accuracy regardless of whether the touch electrode is touched or not.

BRIEF DESCRIPTION OF THE DRAWINGS

FIGS. 9A, 9B, and 9C are drawings for describing the function of the current-controlled oscillator circuit contained in the second modification of the first embodiment, in which FIG. 9A is a drawing for showing the fluctuation state in the count output from the counter due to the operating condition of semiconductor device, FIG. 9B is a drawing for describing the relation between the currents applied to the current-controlled oscillator circuit, and FIG. 9C is a drawing for describing the fluctuation in the count of the counter for TYP condition and BEST condition.

FIG. 15A and FIG. 15B are diagrams for describing the method for judging whether or not there is a touch by the switch circuit contained in the semiconductor device of the third embodiment, in which FIG. 15A shows the parasitic capacitance distribution during non-touching between the touch electrodes, and FIG. 15B shows the parasitic capacitance distribution during touching between the touch electrodes.

DETAILED DESCRIPTION

Figure 1:
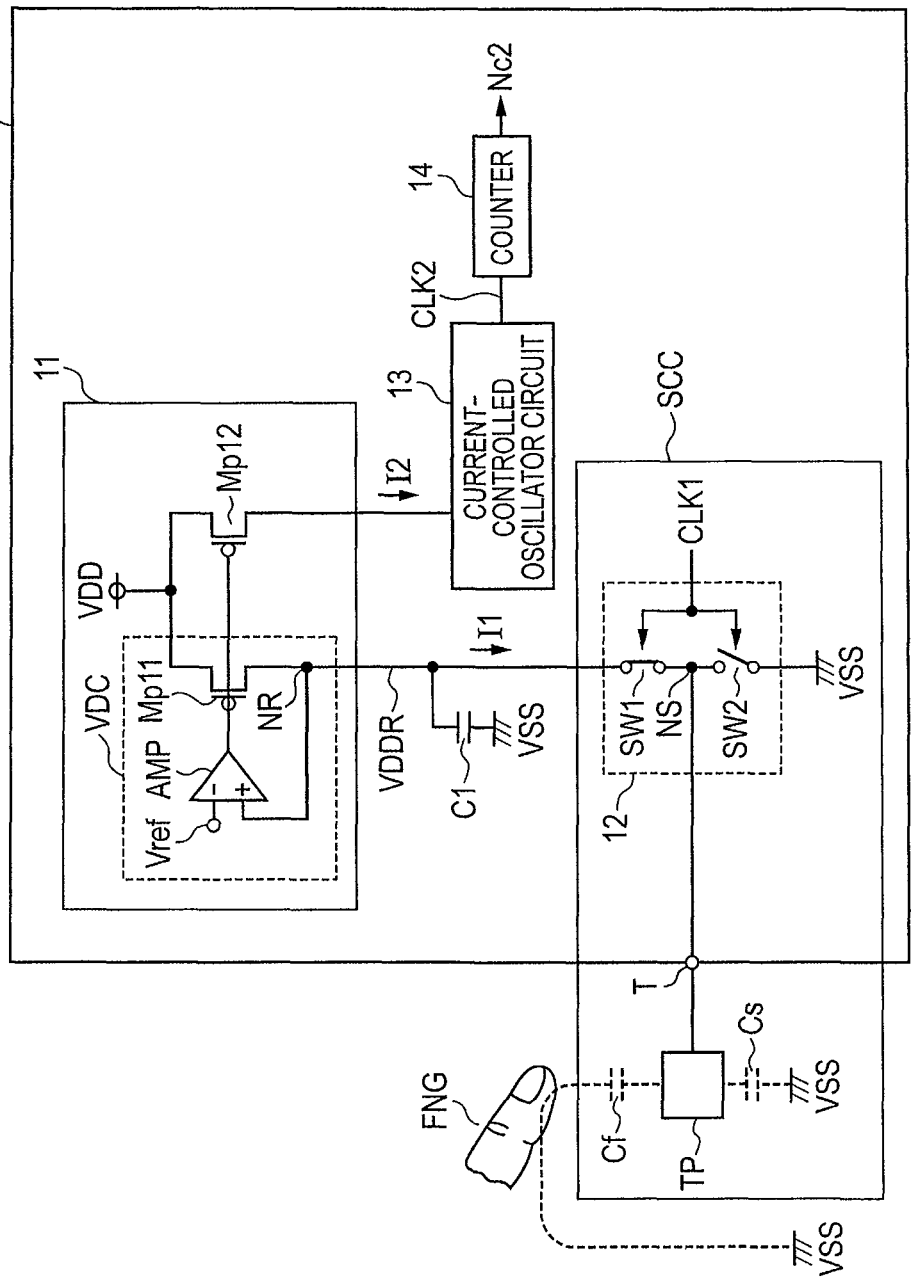
FIG. 1 is a structural block diagram of the semiconductor device of a first embodiment.

The embodiments are described next while referring to the drawings. When describing quantities and amounts in the embodiment description, unless stated otherwise, the invention is not necessarily limited to the stated quantities and amounts. In the drawings for the embodiment, the same reference symbols and reference numerals express identical sections or equivalent sections. Also, in the description of the embodiments, sections and other items assigned with the same reference numerals or reference symbols indicate the same sections or items and in some cases their repeated description is omitted.

First Embodiment

FIG. 1 is a structural block diagram of the semiconductor device 100 of the embodiment.

The semiconductor device 100 contains a touch sensor circuit satisfactory for self-capacitive type touch keys among the capacitive methods. The touch sensor circuit contained in the semiconductor device 100 includes a current mirror circuit 11, a switch circuit 12, a current-controlled oscillator circuit 13, a counter 14, a capacitance C1, and a terminal T. A self-capacitive detection type touch key (not shown in drawing) containing a touch electrode TP is coupled to the terminal T. The combination of this touch electrode TP and the switch circuit 12 form the switched capacitor circuit SCC.

(Current Mirror Circuit 11 Structure)

The current mirror circuit 11 includes a power supply voltage dropping circuit VDC and a p-type transistor Mp12. The power supply voltage dropping circuit VDC drops the power supply voltage VDD, and generates a voltage VDDR supported at a desired voltage value in the node NR. The capacitance C1is coupled to the node NR in order to suppress fluctuations in the voltage VDDR.

The power supply voltage dropping circuit VDC contains a p-type transistor Mp11 and an amplifier AMP. A power supply voltage (hereafter supply voltage) VDD is applied to the source of the p-type transistor Mp11, and the drain is coupled to the node NR. A reference voltage Vref is applied to one input terminal of the amplifier AMP, and the drain voltage of the p-type transistor Mp11 is applied by way of the node NR to the other input terminal. The amplifier AMP controls the gate voltage of the p-type transistor MP11 so as to make the drain voltage of the p-type transistor MP11 or in other words, the node NR voltage equivalent to the reference voltage Vref, and generates a voltage VDDR in the node NR.

A supply voltage VDD is applied to the source of the p-type transistor Mp12, and the gate is coupled to the gate of the p-type transistor Mp11. Namely, the p-type transistor Mp11 and the p-type transistor Mp12 form the current mirror circuit 11. The current drive capability (transistor size) of the p-type transistor Mp11 contained in the power supply voltage dropping circuit VDC is set so as to supply a current I1 required in the switched capacitor circuit SCC described later on. The current drive capability of the p-type transistor Mp12 is set to supply a current I2 required by the current-controlled oscillator circuit 13 described later on.

(Switched capacitor circuit SCC structure and operation)

The switch circuit 12 contains a switch SW1 and a switch SW2. One end of the switch SW1 is coupled to the node NR that outputs a voltage VDDR, and the other end is coupled to the node NS. One end of the switch SW2 is coupled by way of the node NS to the other end of the switch SW1 and a supply voltage VSS (hereafter described in some cases as "ground voltage") is applied to the other end of the switch SW2. The electrical conduction status of the switch SW1 and the switch SW2 change complementarily in response to the clock CLK1. In the low-level period of the clock CLK1 for example, the switch SW1 is set to the conducting state, and the switch SW2 is set to the non-conducting state.

In the low-level period of the clock CLK1, the switch SW1 applies a voltage. VDDR output from the power supply voltage dropping circuit VDC to the terminal T. In the high-level period of the clock CLK1, the switch SW2 applies a supply voltage VSS to the terminal T. As can be understood from the logic level of the clock CLK1 and the change in the complementary conducting states (open and closed states) of the switch SW1 and the switch SW2, the switch circuit 12 operation is the same as a CMOS inverter circuit.

A touch electrode TP contained in a self-capacitive detection type touch key (not shown in drawing) is coupled to the terminal T. The touch electrode TP functions as an electrode for respectively either of the two parasitic capacitances, or namely the parasitic capacitance Cs and the parasitic capacitance Cf. The other electrode of parasitic capacitance Cs corresponds to a ground wire, etc. (not shown in drawing) for a printed circuit board formed on the touch electrode TP periphery. The other electrode of the parasitic capacitance Cf corresponds to finger FNG and person's body (not shown in drawing). The voltage of the other electrodes for the parasitic capacitance Cs and parasitic capacitance Cf are respectively set to a ground voltage by way of the ground wire and finger FNG, etc. The value of the parasitic capacitance Cf increases as the distance between the touch electrode TP and the finger FNG becomes shorter.

The switched capacitor circuit SCC includes the switch circuit 12 and the touch electrode TP. The switch circuit 12 performs charging and discharging of the parasitic capacitance Cs and the parasitic capacitance Cf formed in the touch electrode TP in synchronization with the clock CLK1. In the low-level period of the clock CLK1, the switch circuit 12 applies a voltage VDDR to the touch electrode TP by way of the terminal T, and charges the parasitic capacitance Cs and the parasitic capacitance Cf. In the high-level period of the clock CLK1, the switch circuit 12 applies a supply voltage VSS to the touch electrode TP by way of the terminal T, and discharges the parasitic capacitance Cs and the parasitic capacitance Cf.

When the frequency of the clock CLK1 is fc1, and the capacitance of the touch electrode TP is C, the switched capacitor circuit SCC is seen as having an equivalent resistance R found by the following formula 1.

$$R = 2/(fc1*C) \qquad \text{Formula 1}$$

$$C = Cs + Cf \qquad \text{Formula 2}$$

Here, the symbol "/" and the symbol "*" respectively indicate the division sign and the multiplication sign. The power supply voltage dropping circuit VDC supplies a current I which is the value of voltage VDDR divided by the value of the equivalent resistance R to the switched capacitor circuit SCC.

As can be understood from formula 1 and formula 2, the equivalent resistance R of the switched capacitor circuit SCC comprised of the switch circuit 12 and touch electrode TP fluctuates due to the distance between the finger FNG and the touch electrode TP. Therefore, when the finger FNG touches (hereafter described as during touching or a touched state) the touch electrode TP, the value of the equivalent resistance R decreases as the value of the parasitic capacitance Cf increases, and the value of the current I1 output by the power supply voltage dropping circuit VDC increases. Conversely, when the finger FNG separates away from the touch electrode TP (hereafter described as during non-touching or a non-touched state), the value of the equivalent resistance R increases as the value of the parasitic capacitance Cf decreases, and the current I1 decreases. For confirmatory purposes, the description, "finger FNG touches the touch electrode TP" signifies placing the finger FNG onto the insulator film (not shown, in drawing) over the touch electrode TP.

(Current-Controlled Oscillator Circuit 13 and Counter 14 Structures)

The current-controlled oscillator circuit 13 generates a clock CLK2 whose frequency fc2 changes according to the value of the output current I2 of the current mirror circuit 11. The frequency fc2 of the clock CLK2 increases along with an increase in the output current I2. The counter 14 outputs a count Nc2 for clock CLK2 in an optionally set count time.

The count Nc2 of the counter 14 corresponds to the integrated value spanning the count time for the current I1 supplied to the switched capacitor circuit SCC. Further, the high level of the signal applied to the touch electrode TP by the switch circuit 12, or in other words, the voltage applied to the capacitance C of touch electrode TP is set to the voltage VDDR output by the power supply voltage dropping circuit VDC. The value that is the count Nc2 (integrated value of current I1) divided by the count time therefore corresponds to the value of the capacitance C (=Cs+Cf) of the touch electrode TP.

By detecting fluctuations in the count Nc2 for the count time set to a specified time, the touching or the non-touching by the finger FNG at the touch electrode TP can be detected.

Figure 2:
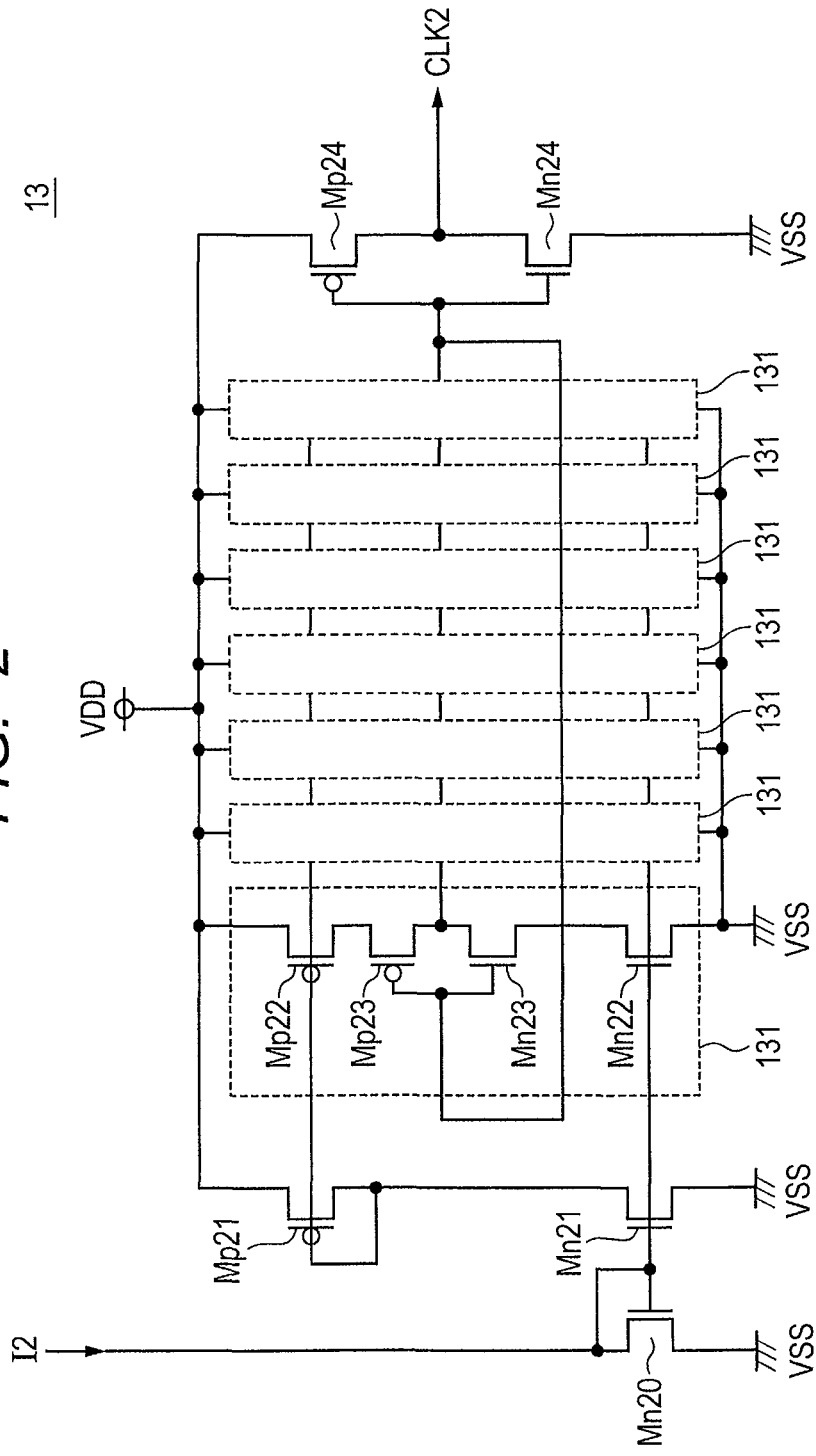
FIG. 2 is a circuit diagram of the current-controlled oscillator circuit contained in the semiconductor device of the first embodiment.

FIG. 2 is a circuit diagram of the current-controlled oscillator circuit 13 contained in the semiconductor device 100 of the first embodiment.

The current-controlled oscillator circuit 13 generates a clock CLK2 whose frequency fluctuates in response to the value of current I2 output from the current mirror circuit 11.

A diode-coupled n-type transistor Mn20 draws the current I2 from the drain, which flows outward from the source to the line of the supply voltage VSS (ground). The gates of the n-type transistor Mn20 and n-type transistor Mn21 are mutually coupled and form a current mirror circuit. A supply voltage VDD is applied to the source of the diode-coupled p-type transistor Mp21, and the gate and drain of the diode-coupled p-type transistor Mp21 are coupled to the drain of the n-type transistor Mn21.

An inverter circuit 131 contains p-type transistors Mp22 and Mp23, and n-type transistors Mn22 and Mn23. A supply voltage VDD is applied to the source of the p-type transistor Mp22, and the drain is coupled to the source of the p-type transistor Mp23. The drain of the p-type transistor Mp23 is coupled to the drain of the n-type transistor Mn23, and the gates of both transistors are mutually coupled together. A supply voltage VSS (ground) is applied to the source of the n-type transistor Mn22, and the drain is coupled to the source of the n-type transistor Mn23.

In the inverter circuit 131, the gate of the p-type transistor Mp22 is coupled to the gate of the p-type transistor Mp21; and the gate of the n-type transistor Mn22 is coupled to the gate of the n-type transistor Mn21. Therefore, the p-type transistors Mp21 and Mp22, and the n-type transistors Mn21 and Mn22 respectively form a current mirror circuit. In other words, the inverter circuit 131 is an inverter circuit whose structure includes a p-type transistor Mp23 and n-type transistor Mn23, and in which a bias current generated based on the current I2, is supplied by way of the p-type transistors Mp22 and n-type transistor Mn22. The delay time of the inverter circuit 131 fluctuates according to the value of the current I2.

The current-controlled oscillator circuit 13 comprises a ring oscillator circuit in which the inverter circuits 131 are coupled in a specified number of stages (7 stages in FIG. 2) in a ring shape. The inverter circuit configured from the p-type transistor Mp24 and n-type transistor Mn24 receives the output from the inverter circuit at the final stage of the ring oscillator circuit and outputs a clock CLK2.

When the value of current I2 increases, the delay time of the inverter circuit 131 decreases, and the value of the frequency fc2 of the clock CLK2 increases. Conversely when the value of the current I2 decreases, the delay time of the inverter circuit 131 increases, and the value of the frequency fc2 decreases. When the finger FNG is touching the touch electrode TP (during touching) the value of the current I2 output from the current mirror circuit 11 increases; and when the finger FNG separates from the touch electrode TP (during non-touching), the value of the current I2 decreases. These fluctuations in the value of the current I2 are dependent on fluctuations in the parasitic capacitance Cf of the touch electrode TP.

In addition to the distance between the finger FNG and touch electrode TP, fluctuations in the value of the current I2 output from the current mirror circuit 11 are also caused by faint noise constantly occurring within the system for the touch panel and touch key. The noise occurring in the touch key system exerts an effect on the operation of the touch sensor circuit contained in the semiconductor device 100, and the effect appears as fluctuations in the frequency fc2 of the clock CLK2 generated by the current-controlled oscillator circuit 13. However, the current-controlled oscillator circuit 13 measures the count Nc2 of the clock CLK2 in the counting period that was set so the effect from fluctuations in the count Nc2 due to noise is reduced.

Figure 3:
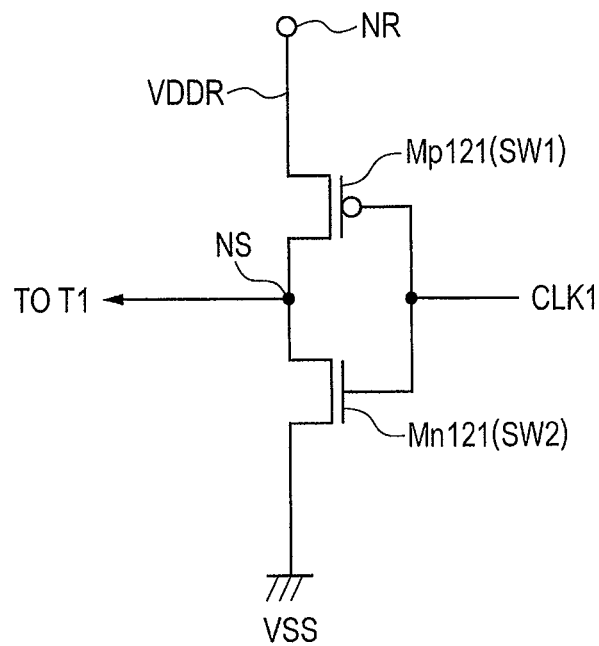
FIG. 3 is a circuit diagram of the switch circuit of the semiconductor device of the first embodiment.

FIG. 3 is a circuit diagram of the switch circuit 12 contained in the semiconductor device 100 of the first embodiment.

The switch circuit 12 operation is identical to the operation of the CMOS inverter circuit as described above. The switch circuit 12 includes a typical CMOS inverter circuit, and the p-type transistor Mp121 and n-type transistor Mn121 respectively correspond to the switch SW1 and the switch SW2 in FIG. 1. The source and the drain of the p-type transistor Mp121 are respectively coupled to the node NR and node NS that supply the voltage VDDR. The drain and the source of the n-type transistor Mn121 are respectively coupled to the node NS and the wiring that supplies the supply voltage VSS. A clock CLK1 is supplied to the gates of both transistors, and the switch circuit 12 performs charging and discharging of the parasitic capacitance of the touch electrode TP in response to the logic level of the clock CLK1.

The driving of the touch electrode TP by the switch circuit 12 that operates as an inverter circuit allows the input/output buffer circuit contained in the semiconductor device 100 to function as a switch for the switched capacitor circuit SCC. When implementing the semiconductor device 100 on a microcomputer, the input/output buffer circuit contained in the microcomputer is allocated to the switch circuit 12 so that the switched capacitor circuit SCC can be implemented without adding new switches for the switched capacitor circuit SCC.

Figure 4:
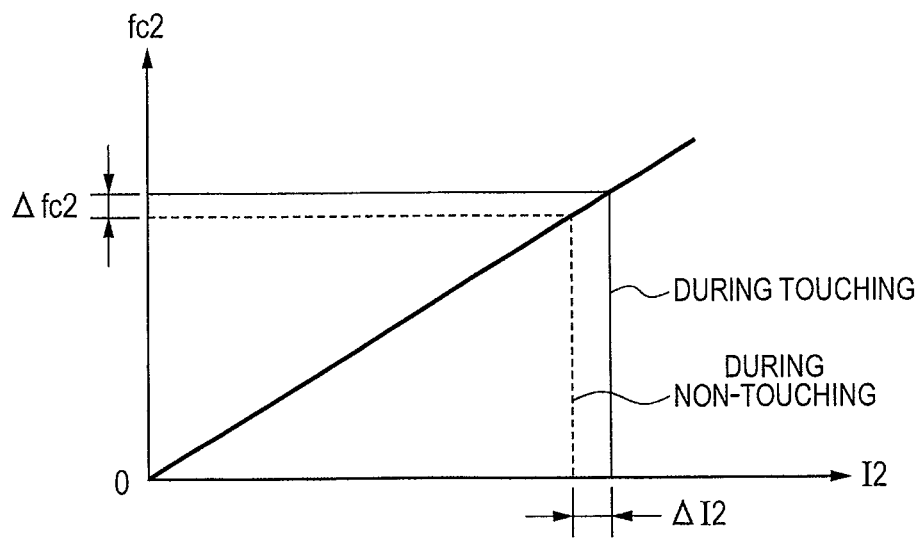
FIG. 4 is a characteristic diagram of the current-controlled oscillator circuit contained in the semiconductor device of the first embodiment.

FIG. 4 is a characteristic diagram of the current-controlled oscillator circuit 13 contained in the semiconductor device 100 of the first embodiment.

The current-controlled oscillator circuit 13 generates a clock CLK2 whose frequency fc2 changes in response to the value of the current I2 output from the current mirror circuit 11. The current-controlled oscillator circuit 13 as described above contains a ring oscillator circuit in which the inverter circuits 131 are coupled in a specified number of stages in a ring shape. In contrast to the non-touched state, when the current I2 during touching increases by $\Delta I2$, the frequency fc2 increases by $\Delta fc2$. The counter 14 counts the count Nc2 correspond to the fluctuation $\Delta fc2$ in this frequency fc2. By adjusting the bias current of the inverter circuit 131 as needed, and setting a proportional relation between the fluctuation amount ΔI2 of current I2 and the fluctuation amount Δfc2 of the frequency fc2, the accuracy for detecting touching or non-touching can be improved.

The effect rendered by the semiconductor device 100 of the first embodiment is described next. The current-controlled oscillator circuit 13 changes the frequency fc2 of the clock CLK2 in response to the current I1 flowing in the switched capacitor circuit SCC, and the counter 14 counts the count Nc2 of the clock CLK2 at a count time set to a specified value. During superimposition of noise in the semiconductor device 100, the counter 14 continues counting of the clock CLK2 during the count time that was set, including when noise was superimposed. Therefore, the effect in which the amount of fluctuation in the count due to noise affecting the count Nc2 during the counting time is not to an extent large enough to cause decision errors when deciding touching or non-touching, and the judgment accuracy for determining touching or non-touching can be maintained.

By operating the input/output buffer contained in the semiconductor device 100 as the switch circuit 12 included in the switched capacitor circuit SCC, new switch circuits are no longer necessary and the semiconductor device 100 can be downsized.

<First Modification of the First Embodiment>

Figure 5:
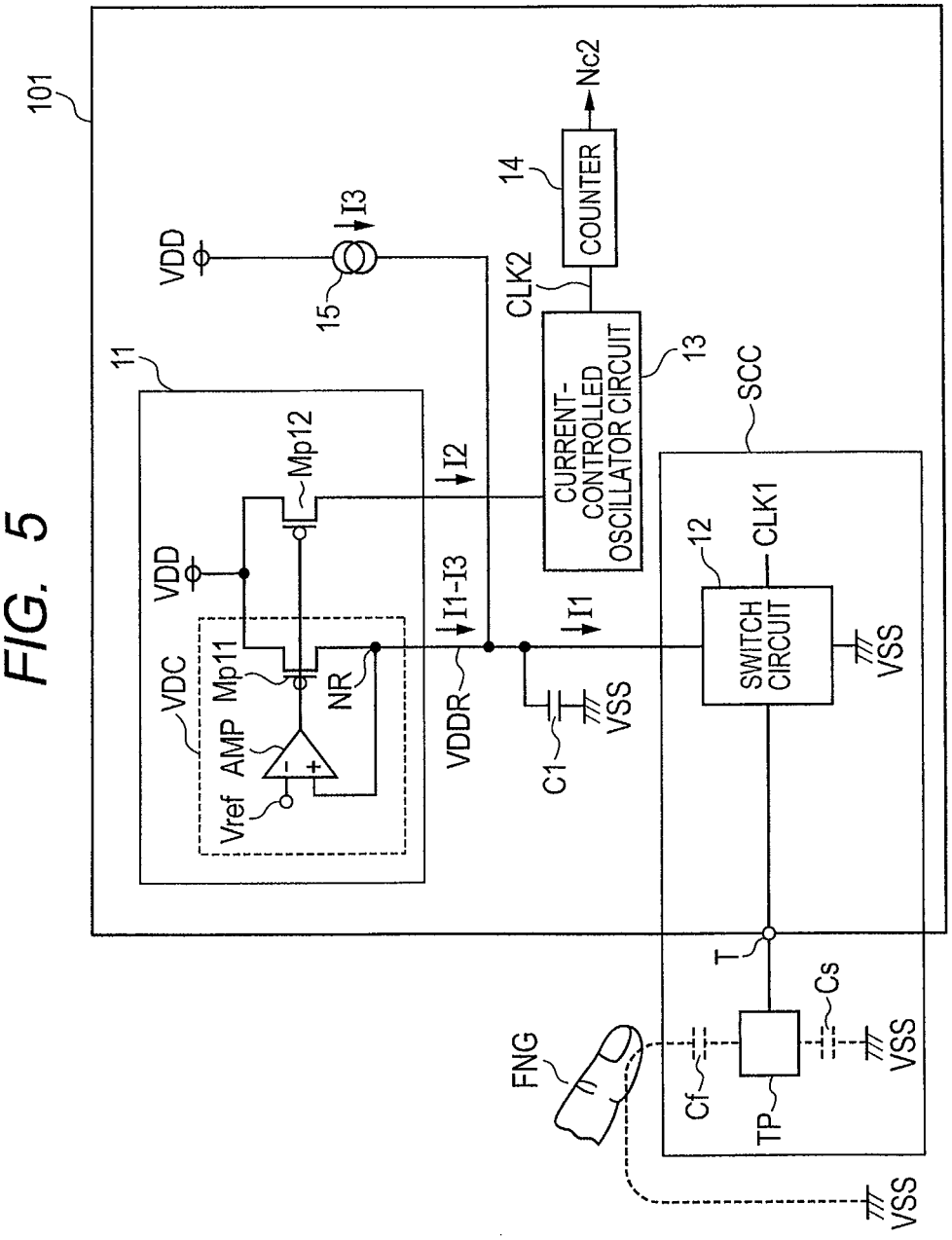
FIG. 5 is a block diagram of the semiconductor device of a first modification of the first embodiment.

FIG. 5 is a block diagram of the semiconductor device 101 of a first modification of the first embodiment.

In FIG. 5, items assigned with reference numerals identical to FIG. 1 have the same structure or function, and their redundant descriptions are omitted. The semiconductor device 101 shown in FIG. 5 has a structure to which a constant current circuit 15 is added to supply the current I3 to the switched capacitor circuit SCC.

The constant current circuit 15 that receives the supply voltage VDD, applies a current I3 to the switched capacitor circuit SCC. In this current I1 flowing into the switched capacitor circuit SCC, the power supply voltage dropping circuit VDC outputs the difference in current (I1−I3) of the current I1 and current I3.

In this structure, while the touch electrode TP is in a non-touched state, the value of the current I3 is set to the same current flowing in the switched capacitor circuit SCC or to a somewhat smaller current quantity. By setting this type of value for current I3, the difference in current (I1−I3) that the power supply voltage dropping circuit VDC supplies can be set to mostly match the increase in current due to the touch electrode TP reaching touched state, and the change in current quantity during touching and during non-touching can be clearly known (better S/N ratio). The value of a "somewhat smaller current quantity" can be set as needed due to fluctuations in the current quantity occurring in the current I1 when the touch electrode TP is in the non-touched state.

The value of the current I2 output from the p-type transistor Mp12 of the current mirror circuit 11 becomes an integrated value (n*(I1−I3)) comprised of the difference in current (I1−I3) for the current drive capability rate n of the p-type transistor Mp12 relative to the current drive capability of p-type transistor Mp11. The value of the current I2 in the semiconductor device 101, decreases by a value equivalent to n times the current I3, from the value (n times the current I1) of current I2 in the semiconductor device 100 shown in FIG. 1.

Figure 6:
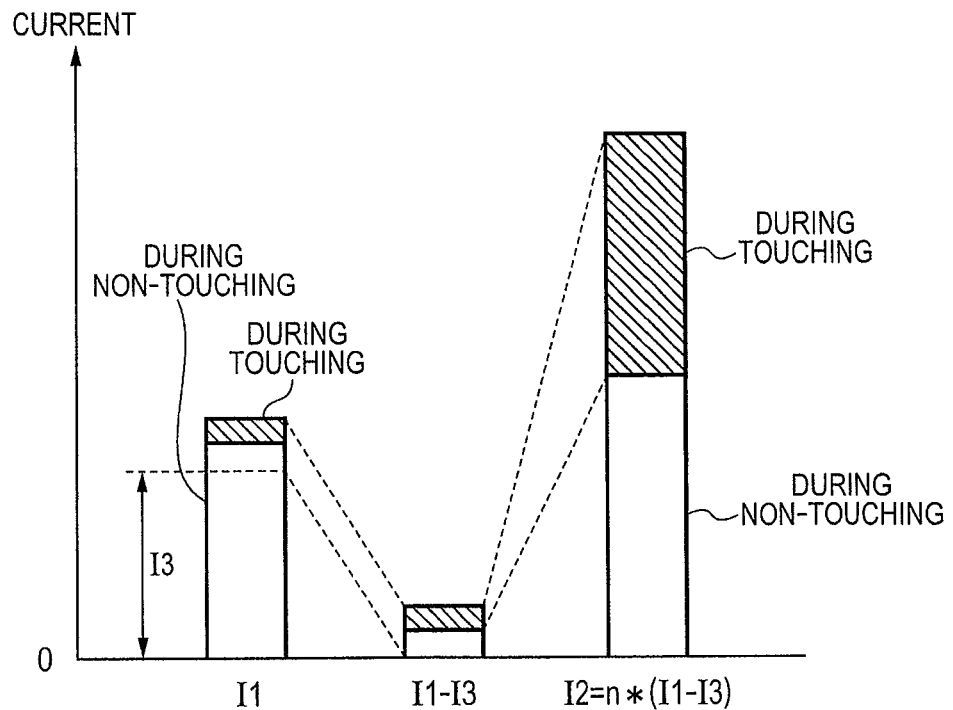
FIG. 6 is a drawing for describing the function of the constant current circuit contained in the semiconductor device of the first modification of the first embodiment.

FIG. 6 is a drawing for describing the function of the constant current circuit 15 contained in the semiconductor device 101 in the first modification of the first embodiment.

In FIG. 6, the left bar in the bar graph shows the state of the change in current I1 in the semiconductor device 100 in FIG. 1. In the semiconductor device 100, compared to during non-touching, the value of the current I1 output by the power supply voltage dropping circuit VDC increases just by a portion equivalent to the increase in parasitic capacitance Cf during touching. FIG. 6 shows an example where a value that is the increase in current I1 during touching subtracted from the value of the current I1 during non-touching is set as the above described "somewhat smaller current quantity" for the current I3 in semiconductor device 101 (FIG. 5).

In FIG. 6, the center bar in the bar graph shows the state of current fluctuations output from the power supply voltage dropping circuit VDC in the semiconductor device 101. The constant current circuit 15 supplies the current I3 to the switched capacitor circuit SCC so that the power supply voltage dropping circuit VDC outputs a current where the current I3 as the offset current is subtracted from the current I1. Just as shown by the bar on the right in the bar graph, the current mirror circuit 11 supplies a current I2 which is value where the current value that is the difference between the current I1 and the current I3 is multiplied by the current drive capability ratio n, to the current-controlled oscillator circuit 13.

The current I2 that is supplied to the current-controlled oscillator circuit 13 is approximately equivalent to the increased value during touching and the value during non-touching just as can be understood from the bar on the right in the bar graph. The ratio of the current I2 value during touching and during non-touching in the semiconductor, device 100 in FIG. 1, is the value of the current I1 shown in the bar on the left in the bar graph in FIG. 6 multiplied by the current drive capability ratio n. Namely, the current I2 during non-touching is dominant among the current I2 values supplied to the current-controlled oscillator circuit 13 during touching and during non-touching.

Supplying the current I3 to the switched capacitor circuit SCC, causes the values of the current I2 supplied to the current-controlled oscillator circuit 13 during touching and during non-touching to become approximately equal, and the values for the count Nc2 of the counter 14 during touching and during non-touching also become approximately equal.

Figure 7:
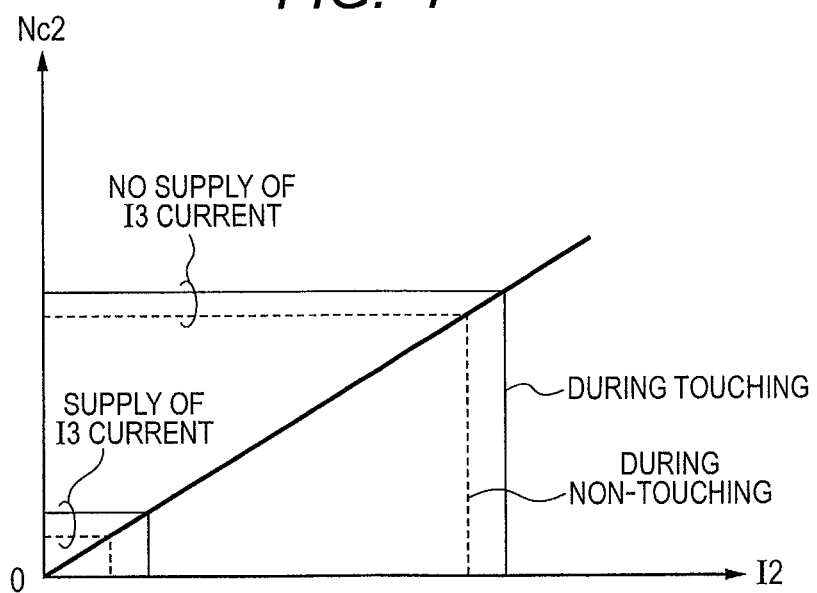
FIG. 7 is a drawing for describing the effect of the constant current circuit contained in the semiconductor device of the modification of the first embodiment.

FIG. 7 is a drawing for describing the effect of the constant current circuit 15 contained in the semiconductor device 101 of the first modification of the first embodiment.

In FIG. 7, the horizontal axis shows the value of current I2 output from the current mirror circuit 11, and the vertical axis shows the count Nc2 output by the counter 14. The vertical axis and the horizontal axis are both an optional scale.

When there is no supply of current I3 to the switched capacitor circuit SCC, the current I2 becomes the dominant value based on the current I1 supplied to the switched capacitor circuit SCC during non-touching. Consequently, when the counter 14 counts the count Nc2 of clock CLK2 across the counting time, the percentage that the increase in value of count Nc2 due to touching of the touch electrode TP by the finger FNG taking up in the count Nc2 during touching is a very slight value. Supplying an offset current I3 to the switched capacitor circuit SCC serves to raise the ratio of the increased value of that count Nc2 to approximately 50 percent.

Making a judgment on whether or not the finger FNG touched the touch electrode TP based on the difference in the Count Nc2 by the counter 14 requires setting the fluctuation quantity in count Nc2 to a certain value level that is not affected by noise. Supplying an offset current I3 to the switched capacitor circuit SCC, improves the above described count ratio, shortens the counting time up to obtaining count needed for judging whether or not touching occurred, and speeds up the touch key response.

<Second Modification of the First Embodiment>

Figure 8:
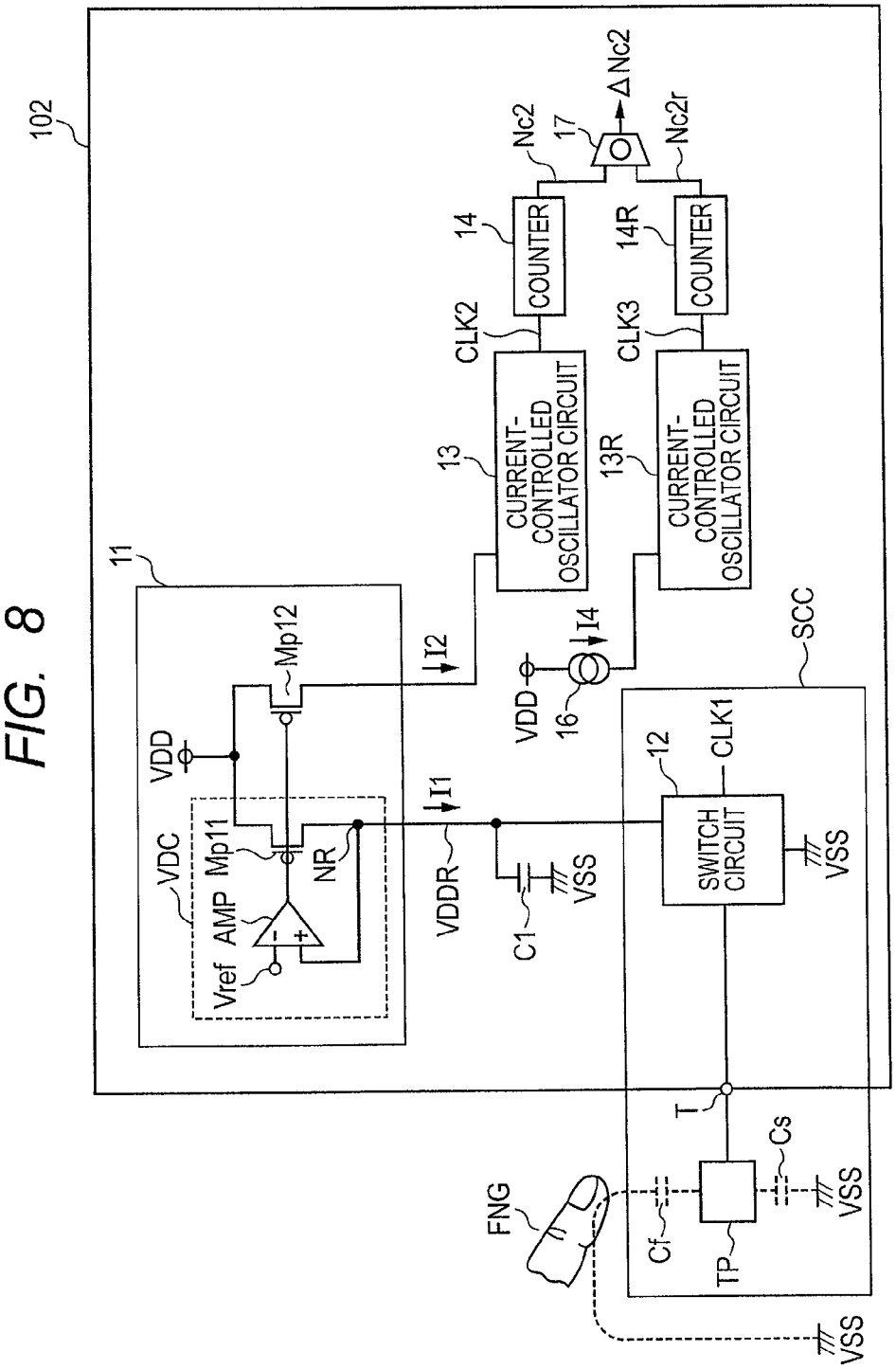
FIG. 8 is a block diagram of the semiconductor device of the second modification of the first embodiment.

FIG. 8 is a block diagram of the semiconductor device 102 of the second modification of the first embodiment.

In FIG. 8, items assigned with reference symbols identical to FIG. 1 are items having the same structure or function, and their redundant sections are omitted.

The semiconductor device 102 contains a constant current circuit 16, a current-controlled oscillator circuit 13R, a counter 14R, and a difference detector 17 in addition to the structure of the semiconductor device 100 shown in FIG. 1.

The constant current circuit 16 where a supply voltage VDD is applied, supplies the current I4 to the current-controlled oscillator circuit 13R. The current-controlled oscillator circuit 13R generates a clock CLK3 whose frequency fc3 changes according to the value of the current I4. The counter 14R includes a circuit structure identical to the counter 14, and outputs a count Nc2r of the clock CLK3 in a count time that is set the same as the counter 14. The difference detector 17 detects the difference between the count Nc2 and the count Nc2r and outputs the result as a difference in the count ΔNc2.

The current-controlled oscillator circuit 13R is a replica circuit containing a circuit structure identical to the current-controlled oscillator circuit 13. By setting the value of the current I4 supplied to the current-controlled oscillator 13R for example to the same value as the current I2 supplied to the current-controlled oscillator circuit 13 while the touch electrode TP is in a non-touched state, the count Nc2 and count Nc2r become mutually equal in a non-touched state, and a difference (Nc2>Nc2r) occurs between the count Nc2 and the count Nc2R in a touched state. Of course, the value of the current I4 may be set to the same value as the current I2 supplied to the current-controlled oscillator circuit 13 while the touch electrode TP is in a touched state. In that case, the relation Nc2<Nc2r occurs between the count Nc2 and the count Nc2r in a non-touched state.

FIG. 9A, FIG. 9B, and FIG. 9C are drawings for describing function of the current-controlled oscillator circuit 13R contained in the semiconductor device 102 in the second modification of the first embodiment, in which FIG. 9A shows the state when the count Nc2 output by the counter 14 fluctuates due to the semiconductor device 102 operating conditions, FIG. 9B is a drawing for describing the relation between the values of the current I2 and the current I4, and FIG. 9C is a drawing for describing the fluctuation in the count of the counters 14 and 14R when the TYP condition (TYP) and BEST condition (Best) are set in the semiconductor device 102 operating conditions.

FIG. 9A shows the state when the count Nc2 output by the counter 14 is fluctuating due to the semiconductor device 102 operating conditions. The horizontal axis shows the value of the current I2 output by the current mirror circuit 11, and the vertical axis shows the value of the count Nc2. The horizontal axis and the vertical axis are both on an optional scale. Here, the "BEST condition" and the "TYP condition" are transistor operating conditions contained in the semiconductor device 102. The "BEST condition" indicates a state in which the supply voltage VDD is the standard upper limit value and the ambient temperature is the standard lower limit value. The "TYP condition" indicates a state in which the supply voltage VDD is the standard center value, and the ambient temperature is room temperature.

The gradient increase in the count Nc2 relative to the increase in the current I2 value steeply increases as the operating condition of the semiconductor device 102 changes from the TYP condition to the BEST condition. This steep increase is due to the improved operating speed of the current-controlled oscillator circuit 13 and the counter 14. The fluctuating values of the count Nc2 during touching and during non-touching of the touch electrode TP for the TYP condition and the BEST condition are respectively the differential count ΔNc2_t and the differential count ΔNc2_b.

As shown in FIG. 9A, the value of the differential count ΔNc2_b is larger than the value of the differential count ΔNc2_t. The value of the count Nc2 fluctuates relative to the same count time of the clock CLK2 by the counter 14 so that when the decision value of the count Nc2 for deciding a touched state or a non-touched state is a fixed value, a misjudgment about whether or not there is a touch on the touch electrode TP, might occur due to the operating conditions of the semiconductor device 102.

FIG. 9B is a drawing for describing the relation between the value of the current I2 applied to the current-controlled oscillator circuit 13, and the value of the current I4 applied to the current-controlled oscillator circuit 13R. As shown in FIG. 9B, the value of current I4 is set to a value where half the increase portion of the current I2 during touching is added to the current I2 during non-touching.

FIG. 9C is a drawing for describing the fluctuation in the count of the counters 14 and 14R, when the TYP condition (Typ) and the BEST condition (Best) are set in the semiconductor device 102 operating conditions. The left side of the graph shows fluctuations in the count of the current-controlled oscillator circuit 13 for the TYP condition and BEST condition, and the right side of the graph shows fluctuations for the TYP condition and BEST condition in the count for the current-controlled oscillator circuit 13R.

Under the TYP condition, the counts Nc2 of the clock CLK2 output by the current-controlled oscillator circuit 13 are respectively count Nc2_0 and Nc2_2 during non-touching and during touching. On the other hand, under the TYP condition, the count Nc2r of the clock CLK3 output by the current-controlled oscillator circuit 13R is count Nc2r_0. The value for the current I2 and the value for the current I4 are set just as in the above described FIG. 9B so that the value of count Nc2r_0 is an average value in the vicinity of the count Nc2_0 and Nc2_2.

Under the BEST condition, the counts of the clock CLK2 output by the current-controlled oscillator circuit 13 are respectively the count Nc2_1 and Nc2_3 during non-touching and during touching. On the other hand, under the BEST condition, the counts Nc2r of the clock CLK3 output by the current-controlled oscillator circuit 13R are the count Nc2r_1. The fluctuations in the operating speed of the counters 14 and 14R, and the current-controlled oscillator circuits 13 and 13R accompanying changes in the operating conditions are the same so that the value of the count Nc2r_1 is an average value in the vicinity of the count Nc2_1 and Nc2_3.

The difference detector 17 detects the difference in the count Nc2 and count Nc2r within the count time. The semiconductor device 102 decides that the finger FNG is touching the touch electrode TP when the value of the count Nc2 is larger than count Nc2r. The semiconductor device 102 decides that the finger FNG is not touching the touch electrode TP when the value of the count Nc2 is smaller than count Nc2r.

The effect of the semiconductor device 102 in the second modification of the first embodiment is as described below.

The current-controlled oscillator circuits 13 changes the frequency fc2 of the clock CLK2 in response to the touching or non-touching of the finger FNG at the touch electrode TP. This frequency fc2 is also dependent on the operating conditions of the semiconductor device 102. The frequency fc3 of clock CLK3 output by the current-controlled oscillator circuit 13R having a structure identical to this current-controlled oscillator circuit 13 fluctuates according to the operating conditions of the semiconductor device 102 the same as the frequency fc2.

By setting the value of the current I4 supplied to the current-controlled oscillator circuits 13R to an intermediate value in a fluctuation range where the current I2 supplied to the current-controlled oscillator circuit 13 varies with touching or non-touching, and by comparing the count Nc2 of clock CLK2 and the count Nc2r of clock CLK3 in a specified time, the problem of misjudging of touching or non-touching caused by fluctuation in operating conditions of the semiconductor device 102 can be prevented.

<Second Embodiment>

Figure 10:
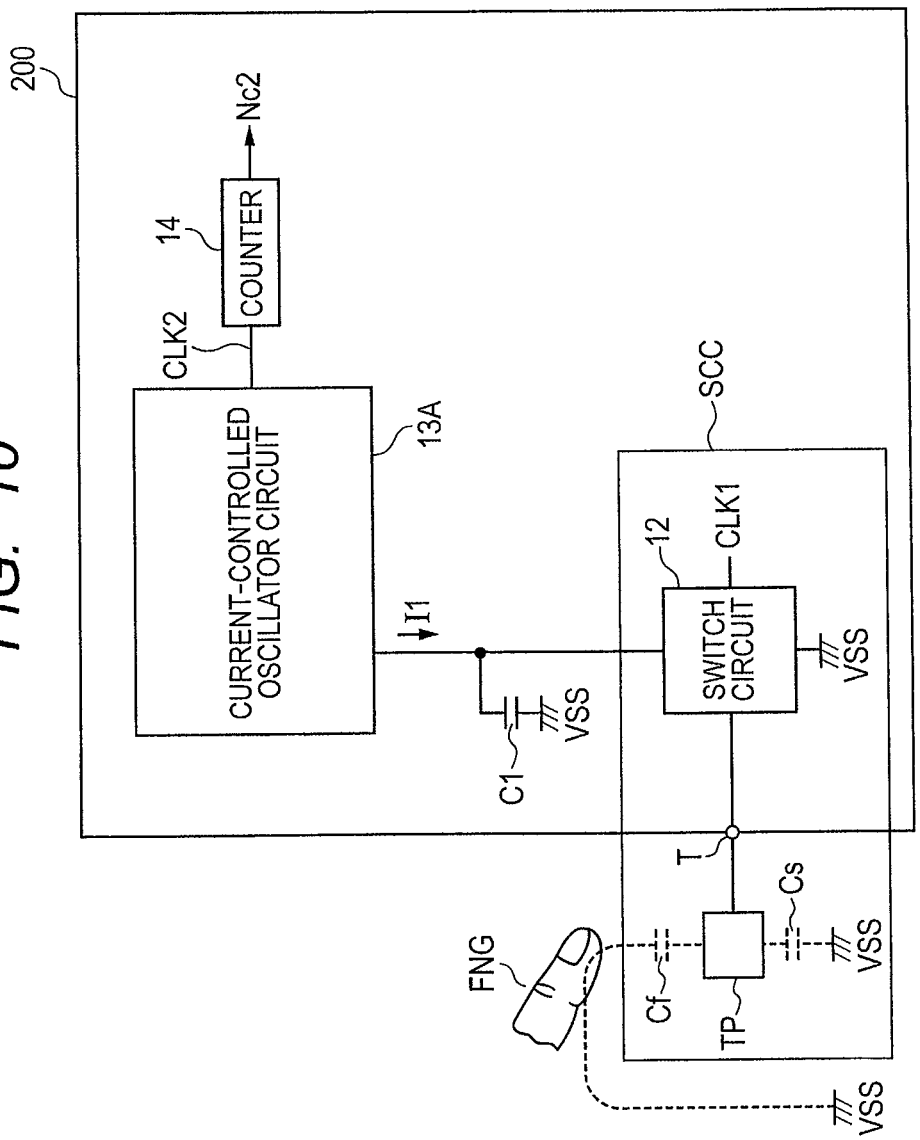
FIG. 10 is a block diagram of the semiconductor device of a second embodiment.

FIG. 10 is a block diagram of the semiconductor device 200 of the second embodiment.

In FIG. 10, items assigned with reference numerals identical to FIG. 1 have the same structure or function, and their redundant descriptions are omitted. In the semiconductor device 200, the current-controlled oscillator circuit 13A outputs a current I1 to the switched capacitor circuit SCC, and changes the frequency fc2 of clock CLK2 in response to that current I1. The counter 14 outputs the count Nc2 of the clock CLK2 in the count time. If the finger FNG touches the touch electrode TP, the value of the current I1 flowing into the switched capacitor circuit SCC increases and the count Nc2 of the clock CLK2 counted by the counter 14 increases.

Figure 11:
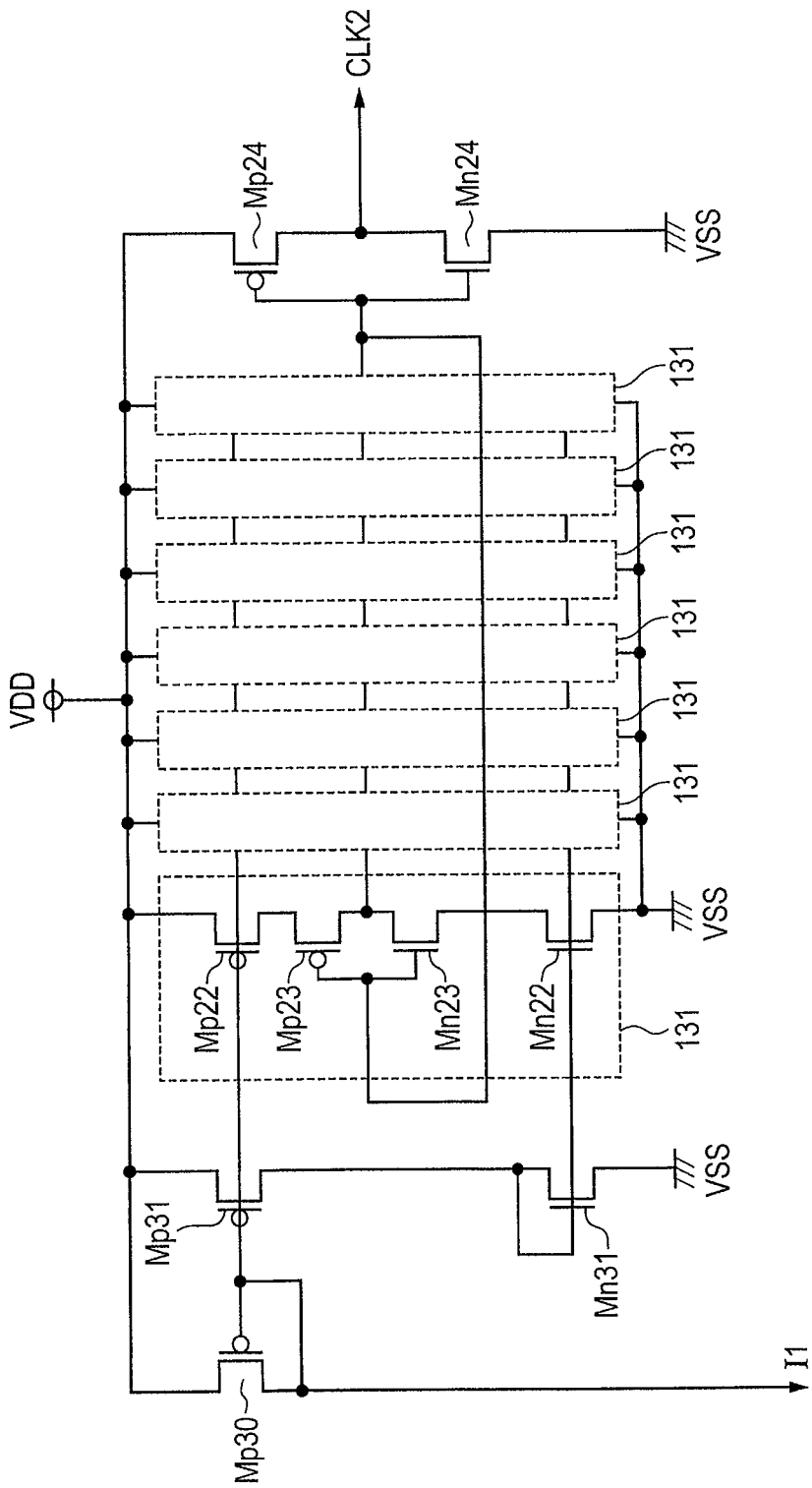
FIG. 11 is a circuit diagram of the current-controlled oscillator circuit contained in the semiconductor device of the second embodiment.

FIG. 11 is a circuit diagram of the current-controlled oscillator circuit 13A contained in the semiconductor device 200 of the second embodiment.

The current-controlled oscillator circuit 13A contains a ring oscillator circuit in which the inverter circuits 131 are coupled in a specified number of stages in a ring shape, the same as the current-controlled oscillator circuit 13 shown in FIG. 2. The diode-coupled p-type transistor Mp30 supplies a current I1 from the source to which a supply voltage VDD is applied to the switch circuit 12 by way of a drain coupled to the gate. The p-type transistor Mp31 and the p-transistor Mp30 are mutually coupled at their gates and form the current mirror circuit. A supply voltage VSS is applied to the source of the diode-coupled n-type transistor Mn31; and the drain of the n-type transistor Mn31 is coupled to the drain of the p-type transistor Mp31.

The p-type transistor Mp22 in the inverter circuit 131 forms a current mirror circuit with the p-type transistor Mp31 to supply a bias current set at an optional level to an inverter circuit comprised of a p-type transistor Mp23 and an n-type transistor Mn23. The n-type transistor Mn22 of the inverter circuit 131 forms a current mirror circuit with the n-type transistor Mn31 to supply a bias current set at an optional level to an inverter circuit comprised of the p-type transistor Mp23 and the n-type transistor Mn23. The inverter circuit comprised of the p-type transistor Mp24 and the n-type transistor Mn24 receives the output from the final stage ring oscillator circuit of the inverter circuit 131 and outputs a clock CLK2.

The effect rendered by the semiconductor device 200 of the second embodiment is described next.

The drain in the p-type transistor Mp30 contained in the current-controlled oscillator circuit 13A supplies a current I1 to the switch circuit 12 contained in the semiconductor device 200. The drain voltage of the diode-coupled p-type transistor Mp30 is clamped at a value that is dropped by a portion of the threshold voltage of the p-type transistor Mp30 from the supply voltage VDD. This clamped voltage fluctuates due to the current I1 value.

The amount of change in current I1 is dependent on the amount of change in the impedance of the switched capacitor circuit SCC approximated by the equivalent resistance R found in formula 1. Specifically, the amount of change is equivalent to the amount of change in the current I1 when the touch electrode TPP is touched by the finger FNG. As shown in FIG. 6, compared to the value of the current I1 during non-touching, the amount of increase in current I1 during touching is not enough to cause a large fluctuation in the value of the drain voltage of the p-type transistor Mp30 supplying the current I1. The frequency fc2 of the clock CLK2 output by the current-controlled oscillator circuit 13A therefore fluctuates based on the increase or decrease in the value of the parasitic capacitance Cf shown in formula 2.

The semiconductor device 200 of the second embodiment is capable of driving the switched capacitor circuit SCC by way of the current-controlled oscillator circuit 13A without supply of a constant voltage from the power supply voltage dropping circuit VDC, and detecting the touching or non-touching of the touch electrode TP. Since the power supply voltage dropping circuit VDC for supplying the current to the switched capacitor circuit SCC can be eliminated, the present embodiment renders the effect of reducing the surface area of the chip and reducing the power consumed in the semiconductor device 200.

Third Embodiment

Figure 12:
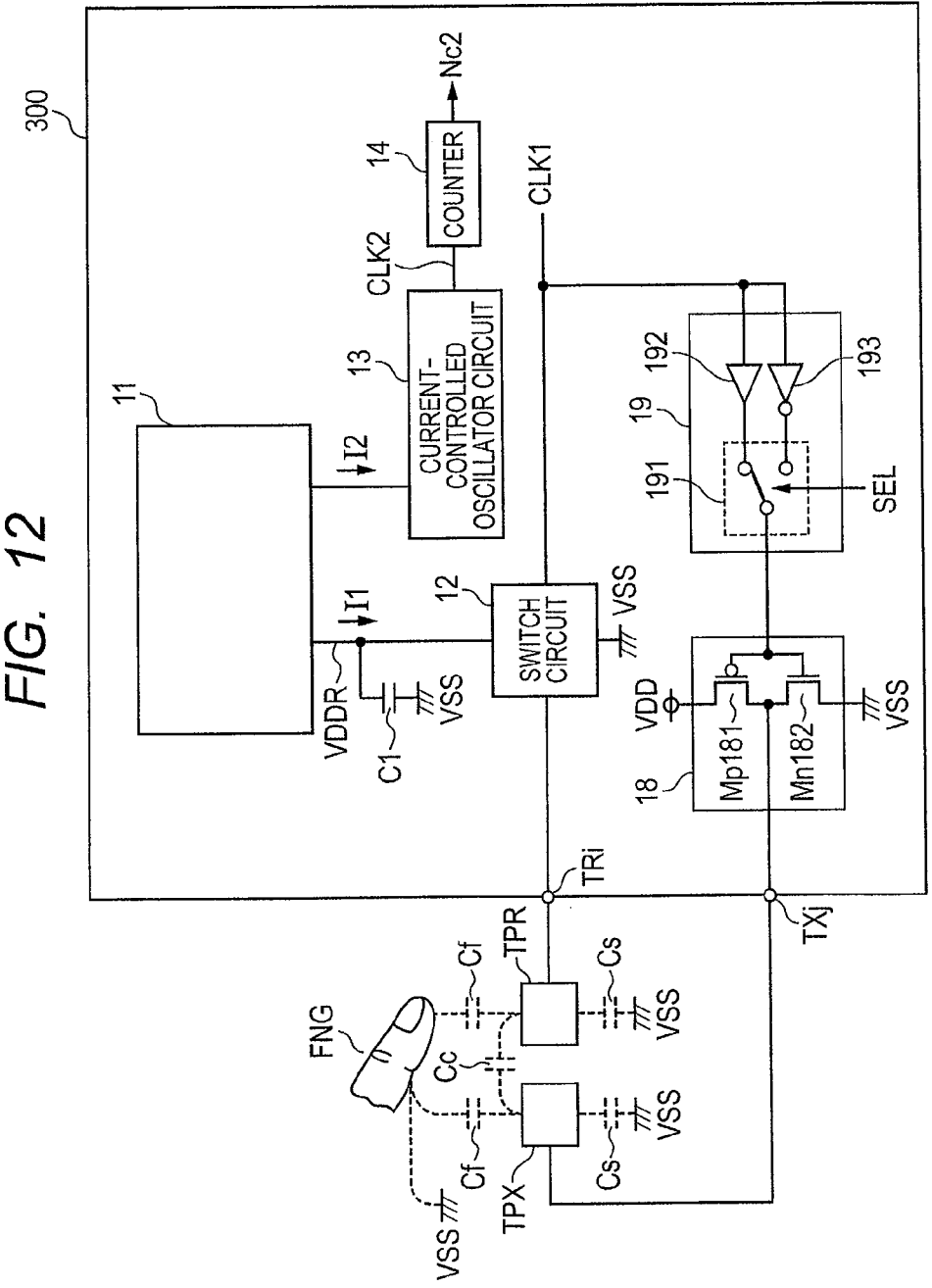
FIG. 12 is a block diagram of the semiconductor device of a third embodiment.

FIG. 12 is a block diagram of the semiconductor device 300 of the third embodiment.

In FIG. 12, items assigned with reference numerals identical to FIG. 1 have the same structure or function, and their redundant descriptions are omitted.

Among the capacitive methods, the semiconductor device 300 contains a touch sensor circuit satisfactory for self-capacitive type touch screens.

The touch sensor circuit contained in the semiconductor device 300 includes a current mirror circuit 11, a switch circuit 12, a current-controlled oscillator circuit 13, a counter 14, a capacitance C1, an output buffer 18, a phase adjuster circuit 19, a terminal TRi, and a terminal TXj. A touch receiving electrode TPR is coupled to the terminal TRi, and a touch sending electrode TPX is coupled to the terminal TXj. As described later on, the touch receiving electrode TPR and touch sending electrode TPX are electrodes formed in a grid shape on the touch screen.

A parasitic capacitance Cs is formed between the touch receiving electrode TPR and the ground wiring. A parasitic capacitance Cs is also formed in the same way between the touch sending electrode TPX and the ground wiring. A parasitic capacitance Cf is formed respectively between the finger FNG and the touch receiving electrode TPR, and between the finger FNG and touch sending electrode TPX. The finger FNG functions as one electrode for the parasitic capacitance Cf, and is set to ground voltage potential by way of the human body. A parasitic capacitance Cc is formed between the touch receiving electrode TPR and the touch sending electrode TPX.

If the distances between the finger FNG, the touch receiving electrode TPR, and the touch sending electrode TPX are sufficiently separated, the value of the parasitic capacitance Cf relative to the parasitic capacitance Cc reduces to an extent that is small enough to be ignored.

As the distance between the finger FNG, the touch receiving electrode TPR, and the touch sending electrode TPX becomes smaller, the value of the parasitic capacitance Cc decreases, and the value of parasitic capacitance Cf increases. These changes in capacitance with a smaller distance are due to a decrease in the number of electric lines of force (reduction in value of parasitic capacitance Cc) occurring between the touch receiving electrode TPR and touch sending electrode TPX along with a decrease in the distance between the touch receiving electrode TPR and touch sending electrode TPX and finger FNG, and due to an increase in the number of electric lines of force (increase in value of parasitic capacitance Cf) occurring between the touch receiving electrode TPR and touch sending electrode TPX and finger FNG.

The phase adjustor circuit 19 includes a switch 191, a buffer 192, and an inverter circuit 193. The buffer 192 and the inverter circuit 193 respectively output an in-phase clock and reversed-phase clock relative to the clock CLK1 to the switch 191. The switch 191 outputs either the buffer 192 output (in-phase with clock CLK1) or the inverter circuit 193 output (reversed phase versus clock CLK1) in response to the logic level of selection signal SEL.

The switch circuit 12 alternately applies a voltage VDDR and supply voltage VSS by way of the terminal TRi to the touch receiving electrode TPR in synchronization with the clock CLK1. The switch circuit 12 applies a low level (supply voltage VSS) to the terminal TRi in the high level period of the clock CLK1, discharges the parasitic capacitance of the touch receiving electrode TPR, and applies a high level (voltage VDDR) to the terminal TRi in the low level period of the clock CLK1, and charges the parasitic capacitance of the touch receiving electrode TPR.

The output buffer 18 is an inverter circuit comprised of a p-type transistor Mp181 having a supply voltage VDD applied to its source, and an n-type transistor Mn182 having a supply voltage VSS applied to its source. The output of the phase adjuster circuit 19 is applied to the gates of both transistors, and the drains of both transistors are coupled to the terminal TXj.

The output buffer 18 alternately applies a supply voltage VDD and supply voltage VSS by way of the terminal TXj to the touch sending electrode TPX in synchronization with the clock CLK1. In the period where the logic level of the select signal SEL is set to the low level (supply voltage VSS); the output buffer 18 applies a low level (supply voltage VSS) to the terminal TXj in the period that the clock CLK1 is at high level and discharges the parasitic capacitance of the touch sending electrode TPX; and applies a high level (supply voltage VDD) to the terminal TXj in the period that the clock CLK1 is at low level and charges the parasitic capacitance of the touch sending electrode TPX. When the logic level of the select signal SEL is set to high level (supply voltage VDD), the relation of the logic level of the clock CLK1 and the voltage level output to the terminal TXj of output buffer 18, is set to the reverse of the relation when the logic level of the above described select signal SEL is set to low level.

The voltage levels applied to the select signal SEL, the touch receiving electrode TPR, and touch sending electrode TPX are as follows. The voltage level applied to the touch receiving electrode TPR and the touch sending electrode TPX in the period (in-phase period) that the select signal SEL is set to one logic level (low level) changes to in-phase in synchronization with the clock CLK1. The voltage level applied to the touch receiving electrode TPR and the touch sending electrode TPX in the period (reversed phase period) where the select signal SEL is set to another logic level (high level) changes to reversed phase in synchronization with the clock CLK1.

Figure 13:
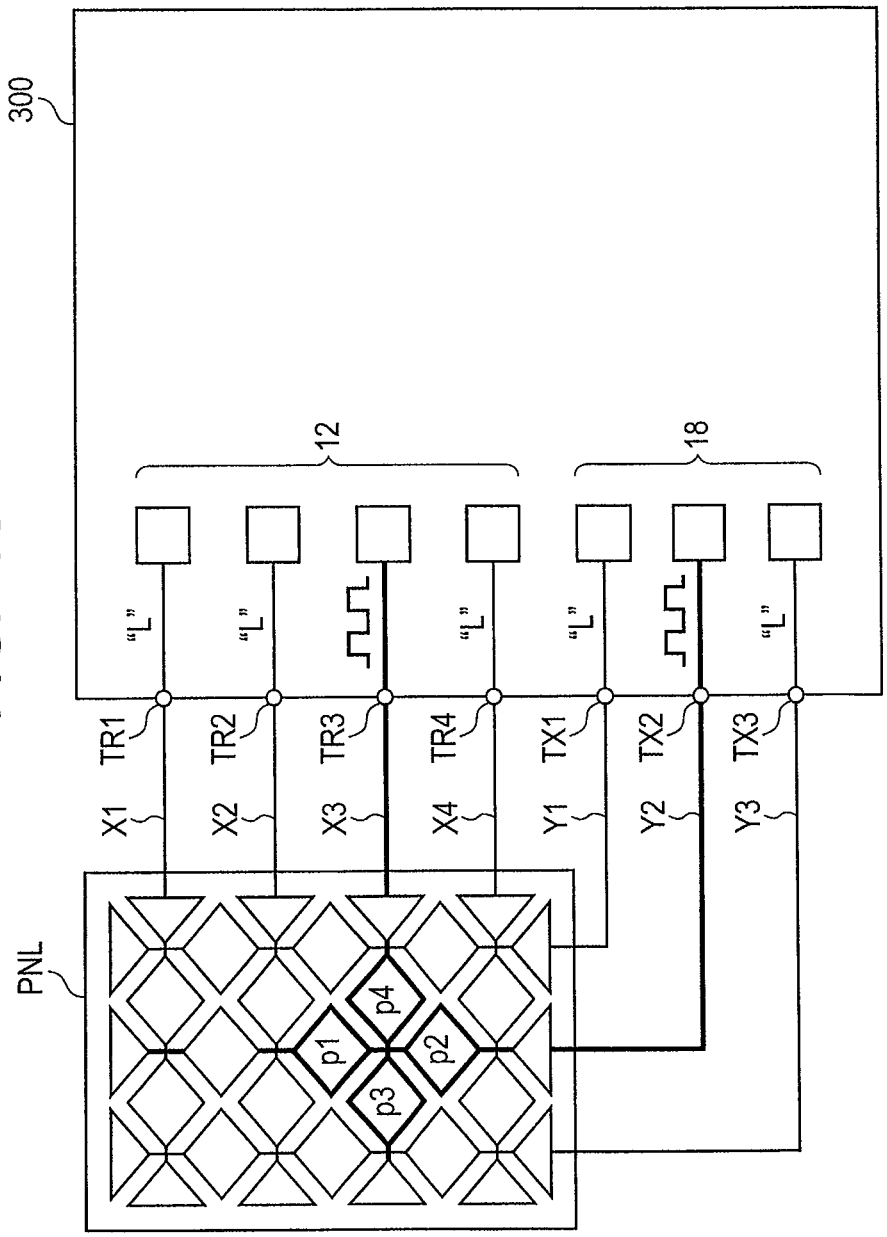
FIG. 13 is a structural view of the touch screen mounting the semiconductor device of the third embodiment.

FIG. 13 is a structural view of the touch screen mounting the semiconductor device 300 of the third embodiment.

The touch screen is comprised of semiconductor device 300 and touch panel PNL. One example of the touch panel PNL is comprised of a diamond or triangular-shaped touch receiving electrode coupled to the X electrode wire Xi (i=1 to 4), and a diamond or triangular-shaped touch sending electrode coupled to a Y electrode wire Yj (j=1 to 3). The x electrode wire Xi and the Y electrode wire Yj are mutually insulated.

The semiconductor device 300 includes plural switch circuits 12 and plural output buffers 18. Each switch circuit 12 sequentially selects an x electrode wire Xi by way of the terminal TRi, and charges and discharges the touch receiving electrode coupled to the selected X electrode wire Xi. Each of the output buffers 18 sequentially selects a Y electrode wire Yj by way of the terminal TXj, and charges and discharges the touch sending electrode coupled to the selected Y electrode wire Yj. The non-selected X electrode wire Xi and the non-selected Y electrode wire Yj are set to low level (supply voltage VSS). FIG. 13 shows the X electrode wire X3 and Y electrode wire Y2 selection states.

The touch receiving electrode TPR coupled to the selected X electrode wire X3, corresponds to the pad electrode p3 and the pad electrode p4. The touch sending electrode TPX coupled to the selected Y electrode wire Y3 corresponds to the pad electrode p1 and the pad electrode p2. The value of the current I1 supplied to the switch circuit 12 by the power supply voltage dropping circuit VDC contained in the current mirror circuit 11 changes according to the change in the value of the parasitic capacitance Cc and parasitic capacitance Cf formed between the finger FNG and the pad electrodes p1 to p4 (Refer to FIG. 12).

Figure 14:
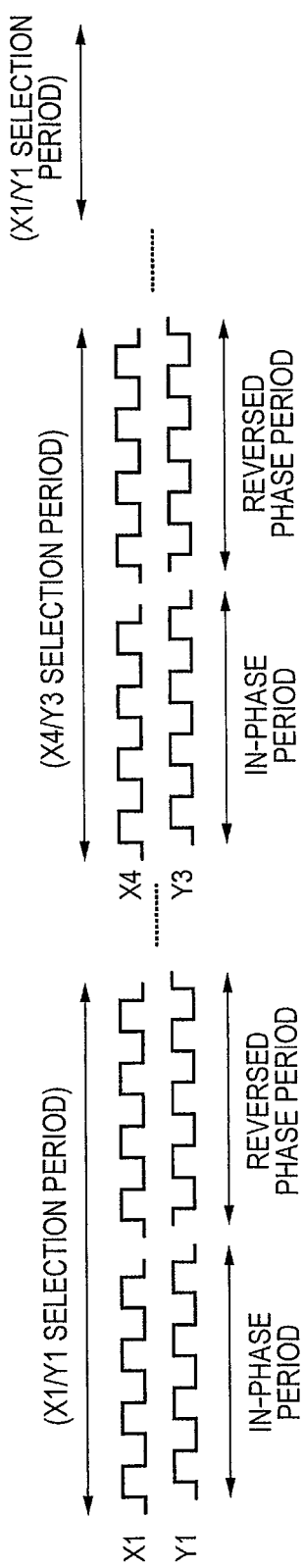
FIG. 14 is an output waveform drawing from the switch circuit and the output buffer contained in the semiconductor device of the third embodiment.

FIG. 14 is a drawing of an output waveform from the switch circuit 12 and the output buffer 18 contained in the semiconductor device 300 of the third embodiment.

The switch circuit 12 and output buffer 18 as described above respectively change the combination of X electrode wire Xi and Y electrode wire Yj for selection, and detect the placement (or non-placement) of the finger FNG between the touch receiving electrode TPR (pad electrode p3 and p4) and the touch sending electrode TPX (pad electrode p1 and p2) across the entire surface of the touch panel PNL.

In the semiconductor device 300, the switch circuit 12 selects the X electrode wire X1, and the output buffer 18 selects the Y electrode wire Y1 (X1/Y1 selection period). In this period, the other X electrode wire Xi and the other Y electrode wire Yi are respectively set to low level (supply voltage VSS) by the switch circuit 12 and the output buffer 18.

During the X1/Y1 selection period, when the selection signal SEL for the low level is applied to the phase adjuster circuit 19, the voltage waveform applied to the touch receiving electrode TPR and the touch sending electrode TPX is changed to in-phase (in-phase period) in synchronization with the clock CLK1. The counter 14 counts' the count Nc2 of the clock CLK2 output by the current-controlled oscillator circuit 13 in the in-phase period set within the specified time (for example 500 μs).

During the in-phase period, the timing that the switch circuit 12 raises the touch receiving electrode TPR voltage from the supply voltage VSS to the voltage VDDR, is approximately the same as the timing that the output buffer 18 raises the touch sending electrode TPX voltage from the supply voltage VSS to the supply voltage VDD. Also, the timing that the switch circuit 12 lowers the touch receiving electrode TPR voltage from the voltage VDDR to the supply voltage VSS, and the timing that the output buffer 18 lowers the touch sending electrode TPX voltage from the supply voltage VDD to the supply voltage VSS, are approximately the same. Namely, the respective output waveforms of the switch circuit 12 and the output buffer 18 are in-phase.

When the selector signal SEL for the high level is applied to the phase adjuster circuit 19, the voltage waveform applied to the touch receiving electrode TPR and the touch sending electrode TPX changes to reversed phase (revered phase period) in synchronization with the clock CLK1. The counter 14 counts the count Nc2 of clock CLK2 in the reversed phase period set within 500 μs.

During the reversed phase period, the timing that the switch circuit 12 raises the touch receiving electrode TPR voltage from the supply voltage VSS to the voltage VDDR is approximately the same as the timing that the output buffer 18 lowers the touch sending electrode TPX voltage from the supply voltage VDD to the supply voltage VSS. Also, the timing that the switch circuit 1 lowers the touch receiving electrode TPR voltage from the voltage VDDR to the supply voltage VSS is approximately the same as the timing that the output buffer 18 raises the touch sending electrode TPX voltage from the supply voltage VSS to the supply voltage VDD. In other words, the respective output waveforms of the switch circuit 12 and the output buffer 18 are in reversed phase.

When the X1/Y1 selection period ends, the switch circuit and the output buffer 18 sequentially switch the X electrode wire Xi and Y electrode wire Yj for selection, and compare the respective count Nc2 for the in-phase and the reversed phase periods during each of the Xi/Yj selection periods. When comparison of the count Nc2 in the X4/Y3 selection period ends, measurement of the count Nc2 during the X1/Y1 selection starts again. The semiconductor device 300 repeats this count cycle. For example in the X3/Y2 selection period, the differential value between the count Nc2 in the in-phase period and the count Nc2 in the reversed phase period, is detected as a smaller value than the differential value in the other Xi/Yj selection period, the semiconductor device 300 decides that the finger FNG is touching at the intersection of the X electrode wire X3 and Y electrode wire Y2 on the touch panel PNL.

Figure 15A:
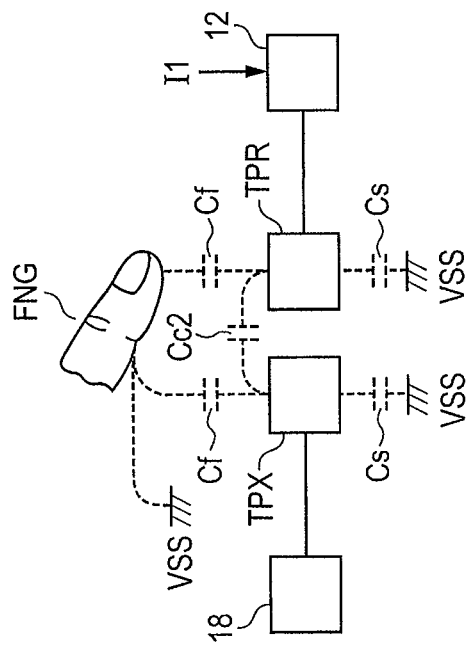
Figure 15B:
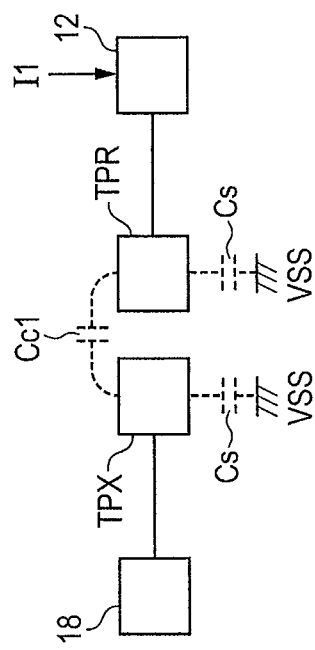

FIG. 15A and FIG. 15B are diagrams for describing the method for judging whether or not there is a touch by the switch circuit 12 contained in the semiconductor device 300 of the third embodiment, in which FIG. 15A shows the parasitic capacitance distribution during non-touching, and FIG. 15B shows the parasitic capacitance distribution during touching between the touch receiving electrode TPR and the touch sending electrode TPX.

(Electrical Charge Supply from Switch Circuit 12 During Non-Touching)

FIG. 15A shows the parasitic capacitance distribution when the finger FNG is not placed (during non-touching) between the touch receiving electrode TPR and touch sending electrode TPX. When the distance between the finger FNG, and the touch receiving electrode TPR and the touch sending electrode TPX are sufficiently separated (during non-touching), the value of the parasitic capacitance Cf between the finger FNG and both touch electrodes relative to the value of the parasitic capacitance Cc1 between the touch receiving electrode TPR and touch sending electrode TPX, reduces to an extent small enough to be ignored. Therefore, a parasitic capacitance Cs is respectively formed between the wiring where the ground voltage is applied and the touch receiving electrode TPR, and between the wiring and the touch sending electrode TPX, and a parasitic capacitance Cc1 is formed between the touch receiving electrode TPR and touch sending electrode TPX.

The electrical charge quantity supplied from the switch circuit 12 in the in-phase period and reversed phase period during non-touching is respectively found from the following formula 31 and formula 32.

$$Q(\text{during non-touching: in-phase period}) = Cs*VDDR + Cc1*(VDDR - VDD) \quad \text{formula 31}$$

$$Q(\text{during non-touching: reversed phase period}) = Cs*VDDR + Cc1*(VDDR + VDD) \quad \text{formula 32}$$

$$Q(\text{during non-touching: difference})Q(\text{during non-touching: reversed phase period}) - Q(\text{during non-touching: in-phase period}) = Cc1*VDD*2 \quad \text{formula 33}$$

Here, the symbol "*" is the multiplication symbol. The symbol VDDR, symbol VDD, and symbol Cc1 are respectively values for the voltage VDDR, supply voltage VDD, and the parasitic capacitance Cc1.

(Electrical Charge Supply from Switch Circuit 12 During Touching)

FIG. 15B shows the parasitic capacitance distribution when the finger FNG is placed (during touching) among the touch receiving electrode TPR and touch sending electrode TPX. When the finger FNG is touching the touch receiving electrode TPR and the touch sending electrode TPX, the number of electric lines of force generated between the finger FNG, the touch receiving electrode TPR and touch sending electrode TPX increase so that a parasitic capacitance Cf is generated. On the other hand, the number of electric lines of force between the touch receiving electrode TPR and touch sending electrode TPX decrease so that the value of the parasitic capacitance Cc2 between the touch receiving electrode TPR and touch sending electrode TPX becomes smaller than the parasitic capacitance Cc1 during non-touching.

$$Cc1 > Cc2 \quad \text{formula 4}$$

Here, the symbols Cc1 and Cc2 are respectively values for the parasitic capacitance Cc1 and Cc2.

In the in-phase period and reversed phase period during touching, the electrical charge quantity supplied from the switch circuit 12 is respectively found from the following formula 51 and formula 52.

$$Q(\text{during touching: in-phase period}) = (Cs + Cf)*VDDR + Cc2*(VDDR - VDD) \quad \text{formula 51}$$

$$Q(\text{during touching: reversed phase period}) = (Cs + Cf)*VDDR + Cc2*(VDDR + VDD) \quad \text{formula 52}$$

$$Q(\text{during touching: difference}) = Q(\text{during touching: reversed phase period}) - Q(\text{during touching: in-phase period}) = Cc2*VDD*2 \quad \text{formula 53}$$

Here, the symbol Cc2 is the value of the parasitic capacitance Cc2.

The difference in the electrical charge quantity supplied in the in-phase period and reversed phase period from the formula 33, formula 4, and formula 53 is reduced just by the value shown in formula 6, by the finger FNG touching the touch receiving electrode TPR and the touch sending electrode TPX.

$$\Delta Q = Q(\text{during non-touching: difference}) - Q(\text{during touching: difference}) = (Cc1 - Cc2) * VDD * 2 \quad \text{formula 6}$$

Here, the symbol "*" is the multiplication symbol.

The decrease in electrical charge quantity causes the power supply voltage dropping circuit VDC to reduce the value of current I1 for supply to the switch circuit 12; causes the a decrease in the value of the current I2 output by the current mirror circuit 11; and further causes a decrease in the count Nc2 output by the counter 14.

In the in-phase period and reversed phase period included within the Xi/Xj selection time, the counter 14 counts the count Nc2 in the respective periods across the identically set counting times. The semiconductor device 300 counts the difference in value of the count Nc2 in the in-phase period relative to the count Nc2 in the reversed phase period on the internal processing circuit (not shown in drawing). When this difference in value is larger than a reference count, the finger FNG is judged as not touching the display region on the touch panel PNL selected by the X electrode wire Xi and the Y electrode wire Yj, when this difference in value is smaller than the reference count, the finger FNG is judged as touching the selection region.

The effect rendered by the semiconductor device 300 of the third embodiment is described.

The switch circuit 12 and the output buffer 18 contained in the semiconductor device 300 respectively select the X electrode wire Xi and the Y electrode wire Yj in sequence by way of the touch panel PNL. A voltage VDDR output by the power supply voltage dropping circuit VDC is applied in synchronization with the clock CLK1, to the touch receiving electrode TPR coupled to the selected X electrode wire Xi. A supply voltage VDD is applied in synchronization with the clock CLK1 to the touch sending electrode TPX coupled to the selected Y electrode wire Yj.

The phase adjuster circuit 19 controls the phase of the output signal from the switch circuit 12 and the output signal of the output buffer 18. When both output signals are set in-phase, the timing that the switch circuit 12 applies a voltage VDDR to the touch receiving electrode TPR, and the timing that the output buffer 18 applies a supply voltage VDD to the touch sending electrode TPX, are approximately the same. When both output signals are set to reversed phase, the voltage VDDR applied to the touch receiving electrode TPR, and the supply voltage VDD applied to the touch sending electrode TPX are alternately applied.

The value of the parasitic capacitance Cc between the touch receiving electrode TPR and the touch sending electrode TPX become lower during touching compared to during non-touching. This change in the value of the parasitic capacitance Cc is detected as a change in the current I1 of the switch circuit 12 during the in-phase period and the reversed phase period, and further converted by the current-controlled oscillator circuit 13 and the counter 14 into a count Nc2 of the clock CLK2 during the counting period. The touching or non-touching of this touch panel PNL and also the finger FNG position during touching can be detected based on the change in this count Nc2.

The currently disclosed embodiments are in all respects merely examples and should not be construed as limiting the present invention. The scope of the present invention is disclosed in the range of the claims and not in the above description, and is intended to include meanings equivalent to the claim and all changes within that range.

What is claimed is:

1. A semiconductor device comprising:
  a terminal;
  a power supply voltage dropping circuit that generates a constant voltage and includes a first transistor that outputs a first current;
  a switch circuit that is supplied with the first current and that periodically applies the constant voltage to the terminal in response to a first clock;
  a first current-controlled oscillator circuit that generates a second clock;
  a first counter that counts the second clock in a counting time; and
  a current mirror circuit that includes the first transistor and a second transistor, and the second transistor supplies a second current to the first current-controlled oscillator circuit,
  wherein a frequency of the second clock changes in response to a value of the first current and a value of the second current.

2. The semiconductor device according to claim 1, further comprising:
  a first constant current source that supplies a third current to the switch circuit.

3. The semiconductor device according to claim 1, wherein the switch circuit is an inverter circuit.

4. The semiconductor device according to claim 3, further comprising:
  a touch electrode coupled to the terminal,
  wherein a value of the first current changes in response to a change in a parasitic capacitance value of the touch electrode coupled to the terminal.

5. The semiconductor device according to claim 4, wherein the change in the parasitic capacitance value of the touch electrode is detected based on a change in the count of the second clock.

6. A semiconductor device comprising:
  a terminal;
  a power supply voltage dropping circuit that generates a constant voltage;
  a switch circuit that periodically applies the constant voltage to the terminal in response to a first clock;
  a first current-controlled oscillator circuit; and
  a first counter,
  wherein the power supply voltage dropping circuit supplies a first current to the switch circuit,
  wherein the first current-controlled oscillator circuit generates a second clock whose frequency changes in response to a value of the first current,
  wherein the first counter counts the second clock in a counting time,
  wherein the semiconductor device further comprises:
  a second transistor,
  wherein the power supply voltage dropping circuit includes a first transistor that outputs the first current,
  wherein a current mirror circuit includes the first transistor and the second transistor, and
  wherein the second transistor supplies a second current to the first current-controlled oscillator circuit.

7. The semiconductor device according to claim 6, wherein a frequency of the second clock changes in response to a value of the second current.

8. The semiconductor device according to claim 7, further comprising:
  a first constant current source that supplies a third current to the switch circuit.

9. The semiconductor device according to claim 7, wherein the switch circuit is an inverter circuit.

10. The semiconductor device according to claim 9, wherein the value of the first current changes in response to a change in a parasitic capacitance value of a touch electrode coupled to the terminal.

11. The semiconductor device according to claim 10, wherein the change in the parasitic capacitance value of the touch electrode is detected based on a change in the count of the second clock.

12. A semiconductor device comprising:
a terminal;
a power supply voltage dropping circuit that generates a constant voltage and includes a first transistor that outputs a first current;
a switch circuit that is supplied with the first current and that periodically applies the constant voltage to the terminal in response to a first clock;
a first current-controlled oscillator circuit that generates a second clock;
a first counter that counts the second clock in a counting time;
a current mirror circuit that includes the first transistor and a second transistor, and the second transistor supplies a second current to the first current-controlled oscillator circuit; and
a touch electrode coupled to the terminal,
wherein a frequency of the second clock changes in response to a value of the first current and a value of the second current, and
wherein a value of the first current changes in response to a change in a parasitic capacitance value of the touch electrode coupled to the terminal.

13. The semiconductor device according to claim 12, further comprising:
a first constant current source that supplies a third current to the switch circuit.

14. The semiconductor device according to claim 12, further comprising:
wherein the switch circuit is an inverter circuit.

* * * * *